(12) United States Patent
Subramanian

(10) Patent No.: US 6,296,945 B1
(45) Date of Patent: Oct. 2, 2001

(54) IN-SITU FORMATION OF MULTIPHASE ELECTRON BEAM PHYSICAL VAPOR DEPOSITED BARRIER COATINGS FOR TURBINE COMPONENTS

(75) Inventor: Ramesh Subramanian, Oviedo, FL (US)

(73) Assignee: Siemens Westinghouse Power Corporation, Orlando, FL (US)

( * ) Notice: Subject to any disclaimer, the term of this patent is extended or adjusted under 35 U.S.C. 154(b) by 0 days.

(21) Appl. No.: 09/393,415

(22) Filed: Sep. 10, 1999

(51) Int. Cl.[7] .................................................. B32B 9/00
(52) U.S. Cl. ...................... 428/469; 428/472; 428/472.2; 428/937; 416/241 B
(58) Field of Search .................................. 428/469, 472, 428/472.2, 937; 416/241 B

(56) References Cited

U.S. PATENT DOCUMENTS

| | | |
|---|---|---|
| 4,321,311 | 3/1982 | Strangman . |
| 4,916,022 | 4/1990 | Solfest et al. . |
| 5,238,752 | 8/1993 | Duderstadt et al. . |
| 5,562,998 | 10/1996 | Strangman . |
| 5,630,314 | 5/1997 | Kojima et al. . |
| 5,683,825 | 11/1997 | Bruce et al. . |
| 5,716,720 | 2/1998 | Murphy . |
| 5,763,107 | 6/1998 | Rickerby et al. . |
| 5,830,586 | 11/1998 | Gray et al. . |
| 5,846,605 | 12/1998 | Rickerby et al. . |

FOREIGN PATENT DOCUMENTS

| | | |
|---|---|---|
| WO 96/31687 | 10/1996 | (WO) . |
| WO 99/18259 | 4/1999 | (WO) . |

Primary Examiner—Deborah Jones
Assistant Examiner—Bryant Young

(57) ABSTRACT

A turbine component (10), such as a turbine blade, is provided which is made of a metal alloy (22) and a base columnar thermal barrier coating (20) on the alloy surface, where a heat resistant ceramic oxide sheath material (32' or 34') covers the columns (28), and the sheath material is the reaction product of a precursor ceramic oxide sheath material and the base thermal barrier coating material.

7 Claims, 1 Drawing Sheet

IN-SITU FORMATION OF MULTIPHASE ELECTRON BEAM PHYSICAL VAPOR DEPOSITED BARRIER COATINGS FOR TURBINE COMPONENTS

GOVERNMENT CONTRACT

The Government of the United States of America has rights in this invention pursuant to Contract DE-AC05-950R22242, awarded by the United State Department of Energy.

BACKGROUND OF THE INVENTION

1. Field of the Invention

This invention relates generally to the field of thermal barrier coatings, and more particularly to a thermal barrier coating for a very high temperature application such as a combustion turbine engine. In particular, this invention relates to the field of multiphase ceramic thermal barrier coatings for high temperature application for coating superalloy components of a combustion turbine.

2. Background Information

The demand for continued improvement in the efficiency of combustion turbine and combined cycle power plants has driven the designers of these systems to specify increasingly higher firing temperatures in the combustion portions of these systems. Although nickel and cobalt based "superalloy" materials are now used for components in the hot gas flow path, such as combustor transition pieces and turbine rotating and stationary blades, even these superalloy materials are not capable of surviving long term operation at temperatures sometimes exceeding 1,200° C.

Examples of cobalt or nickel based superalloys are, for example, Cr.Al.Co.Ta.Mo.W, which has been used for making SC turbine blades and vanes for gas turbines, as taught, for example, in U.S. Pat. No. 5,716,720 (Murphy). These turbine components are generally protected by a basecoat of MCrAlY, where M is selected from the group of Fe, Co, Ni, and their mixtures, as taught for example, by U.S. Pat. Nos. 5,763,107 and 5,846,605 (both Rickerby et al.) and by U.S. Pat. Nos. 4,916,022; 5,238,752; 5,562,998; and 5,683,825 (Solfest et al.; Duderstadt et al.; Strangman; and Bruce et al., respectively). These basecoats are usually covered by an aluminum oxide layer and a final thermal barrier coating ("TBC"). The standard thermal barrier coating, however, is made from yttria-stabilized zirconia, ceria-stabilized zirconia, scandia-stabilized zirconia or non-stabilized zirconia, as taught, for example, by U.S. Pat. No. 5,683,825 Bruce et al. patent. A particularly useful state of the art TBC is 8 wt. % yttria stabilized zirconia ("8YSZ").

Many of the ceramic thermal barrier layers are deposited as a columnar structure in the direction of the coating layer thickness, as taught in U.S. Pat. Nos. 4,321,311 and 5,830,586 (Strangman and Gray et al., respectively). This structure can be formed by electron beam physical vapor deposition ("EBPVD") as in Bruce et al. U.S. Pat. No. 5,683,825, or a combination of electron beam deposition and ion beam irradiation, or the like, such as the $ZrO_2$ thermal barrier layer taught in U.S. Pat. No. 5,630,314 (Kojima et al.). Strangman U.S. Pat. No. 5,562,998, additionally vapor infiltration or sol-gel coats the columnar grains with a submicron thick layer of unstabilized zirconia or unstabilized hafnia, functioning as a bond inhibitor between the discrete columns.

Modern gas turbine engines can achieve higher efficiencies by increasing the turbine inlet temperatures. This subjects the TBCs to high temperatures. TBC materials that are phase stable at high temperatures upon long term exposure will be required. The current state-of-the-art electron beam physical vapor deposited ("EBPVD") 8 YSZ coatings destabilize above approximately 1200° C. In addition, the long term high temperature exposure leads to potential sintering and loss of strain compliance, and possible premature TBC failure. 8YSZ coatings are also susceptible to corrosion upon exposure to contaminants in the fuel and erosion due to foreign object damage. Therefore, some of the key requirements for new TBC candidates for high temperature applications are high temperature phase stability, a reduced tendency to sinter, good corrosion and erosion resistance, all of them to be maintained upon long term exposure. These requirements are in addition to the primary needs of a TBC, such as, a low thermal conductivity with minimal coefficient of thermal expansion mismatch with the superalloy substrate.

SUMMARY OF THE INVENTION

Therefore, it is a main object of this invention to provide improved thermal barrier coating layers for use on underlayers, such as alumina and MCrAly, protecting turbine components, such as superalloy turbine blade assemblies that can operate over 1000° C.

These and other objects of the invention are accomplished by providing a turbine component comprising a metal alloy substrate and a columnar thermal barrier coating on the substrate surface the coating having (a) a columnar-grained ceramic oxide structural material base and (b) a heat resistant ceramic oxide sheath material covering the columns of the base, where the sheath comprises the reaction product of a ceramic oxide precursor sheath material which consists essentially of the composition $C_ZO_W$ and the ceramic oxide columnar structural material which consists essentially of the composition $(A,B)_xO_y$, where A and B are selected from stable oxides which will react with $C_ZO_W$, and C is selected from stable oxides that will react with $(A,B)_xO_y$. A, B and C can be, for example, at least one of $Al_2O_3$, CaO, $Y_2O_3$, $Sc_2O_3$, $ZrO_2$, MgO, and the like.

The preferred precursor sheath material is a thin coating of alumina, $Al_2O_3$ and the preferred base column material is yttria stabilized zirconia where yttria, $Y_2O_3$, content can range from dopant amounts of 10 wt %–20 wt % of the total up to 60 wt % of the total with zirconia $ZrO_2$. The preferred structure is one of discrete columns disposed in the direction of the coating thickness, separated by a microcrack volume. The reaction product can be prompted upon heating to about 1200° C. to 1500° C. and has the composition, in this preferred case, of a material comprising $Y_3Al_5O_{12}$. Another preferred material is the use of rare earth oxide-stabilized zirconia deposited as columns, and an oxide such as $Al_2O_3$ deposited between the columns to initiate the reaction between the rare earth oxide ("ReO") in the stabilized $ZrO_2$ and $Al_2O_3$ to form a reaction product ReO and $Al_2O_3$, for example, $Re_3Al_5O_{12}$ The invention also resides in a method of making a turbine component having a coated, adherent columnar thermal barrier coating on its surface comprising the steps of: (a) providing a nickel or cobalt based superalloy substrate; (b) depositing a columnar-grained ceramic base thermal barrier coating comprising stabilized zirconia, where the thermal barrier coating comprises discrete columns with microcrack volumes between columns; (c) separately depositing a precursor sheath oxide material between the discrete columns of the base thermal barrier coating, which precursor sheath oxide is capable of reacting with the stabilized zirconia of the base thermal barrier coating; and (d) prompting a reaction between the precursor sheath oxide material and the thermal barrier coating to provide a heat resistant sheath material reaction product. Usually, the reaction is prompted by heating the substrate before service or when the component is in service. The precursor sheath oxide material consists essentially of the composition $C_ZO_w$, where C is selected from stable oxides that will react with the stabilized zirconia of the thermal barrier coating. Also, one can apply the TBC and overlay coating precursor onto a hot substrate operating as a heat sink with enough heat to prompt formation of the overlay coating reaction product. The reaction product exterior sheath coatings of the invention can be a continuous layer completely covering the columns or a discontinued layer partly covering the columns. These multiphase TBCs are phase stable and strain tolerant up to temperatures higher than 1400° C. for very long term exposures and provide additional benefits of erosion and corrosion resistance. Also, the invention described here can readily be adapted to current production sequences with an additional step of chemical vapor deposition or other infiltration processes of the overlay coating by a non-line-of-sight process. The coating process is economically feasible and thus has an opportunity for ease of transfer of the technology to production.

Usually, the thermal barrier coating will be disposed upon an alumina coated MCrAly type alloy layer covering an alloy turbine substrate; where M ("metal") is selected from the group consisting of Fe, Co, Ni and mixtures thereof. The turbine component can be a turbine blade, a turbine vane, combustors, transitions, ring segments or the like, of a high temperature gas turbine. The reaction product of this invention can perform any or all of the following functions: a sintering inhibitor between grain columns of the TBC, a low thermal conductivity coating, an erosion resistant coating, and a corrosion resistant coating.

BRIEF DESCRIPTION OF THE DRAWINGS

The above and other advantages of this invention will be more apparent from the following description in view of the drawings which show.

DESCRIPTION OF THE PREFERRED EMBODIMENT

Figure 1:
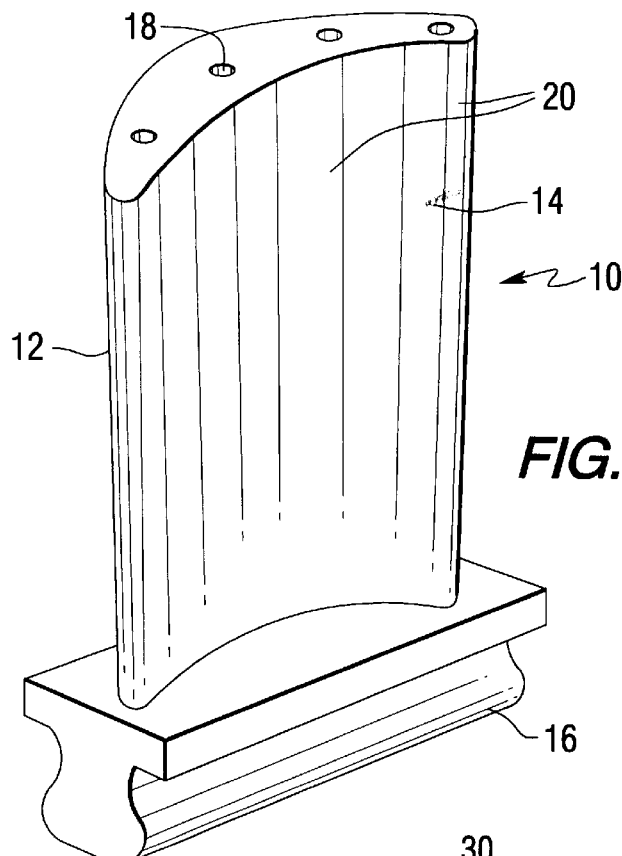
FIG. 1 is a perspective view of a turbine blade having a thermal barrier coating thereon.

Referring now to FIG. 1, one component of a turbine is shown. Turbine blade 10 has a leading edge 12 and an airfoil section 14 against which hot combustion gases are directed during operation of the turbine and which is subject to severe thermal stresses, oxidation and corrosion. The root end 16 of the blade anchors the blade. Cooling passages 18 may be present through the blade to allow cooling air to transfer heat from the blade. The blade itself can be made from a high temperature resistant nickel or cobalt based superalloy, such as a combinatiorn of Ni.Cr.Al.Co.Ta.Mo.W, or more specifically a composition of, for example, by weight, 10% Co, 8.4% Cr, 0.65% Mo, 10% W, 3.3% Ta, 1.05% Ti, 5.5% Al, and 1.4% Hf, with minor amounts of Zr, C, and B in a Ni matrix (commercially known as "MAR-M247 alloy").

The thermal barrier coating 20 would cover the body of the turbine blade. Use of the coating on the turbine blade of FIG. 1 is only illustrative. The coating can be used on other components of turbines used with generators, such as, turbine vanes, buckets, nozzles, or the like, or upon any substrate made of, for example, metal or ceramic, where thermal protection is required.

Figure 2:
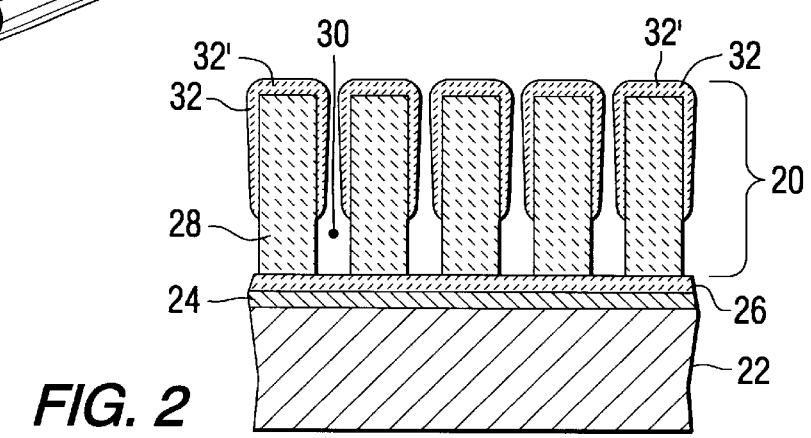
FIG. 2, which best shows the invention, is a fragmented sectional view through a turbine component, such as the turbine blade of FIG. 1, showing the discrete columnar-grain structure with a sheath coating.

FIG. 2 shows one example of possible coating system for protection of a turbine component substrate 22 such as the superalloy core of a turbine blade. A metallic bond layer 24 of a MCrAly type alloy can be used as a first layer on the substrate, where M ("metal") in the alloy is selected from the group of Ni, Co, Fe and their mixtures, and Y can include yttrium Y, as well as La and Hf. This layer can be applied by sputtering, electron beam vapor deposition or low pressure plasma spraying, to provide a dense, relatively uniform layer about 0.002 cm to 0.0245 cm (0.001 inch to 0.01 inch) thick. This layer can subsequently be polished to provide a smooth finish. One purpose of this layer is to allow an oxide scale 26 predominantly alumina to form, in order to further protect the substrate 22 from oxidative attack. The scale layer 26 also provides a good bonding surface for the exterior, top coat, ceramic thermal barrier coating 20 which is shown in FIG. 2 in a strain tolerant columnar-grained structure deposited by electron beam physical vapor deposition ("EBPVD"), with discrete columns 28 oriented substantially perpendicular to the surface of the substrate 22. Such a columnar structure has discreet microcracks 30 providing microcrack volumes between columns 28 of the columnar structure.

Various combinations of underlayers 24 and 26 can be used within the scope of this invention and in some instances, the thermal barrier coatings 20 of this invention can be directly deposited on the substrate 22. The ceramic thermal barrier can be applied by any method providing good adherence effective in a thickness effective to provide the required thermal protection for the substrate 22, usually in the order of about 50 micrometers to about 350 micrometers. Preferably, the ceramic thermal barrier is applied by EBPVD.

Figure 3:
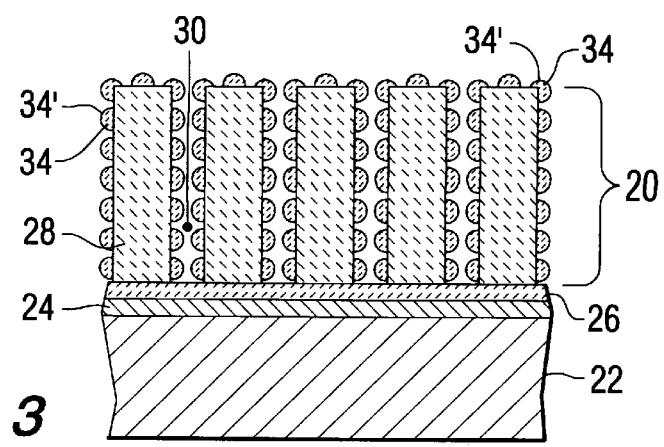
FIG. 3, shows a fragmented view of the turbine blade of FIG. 1, showing the discreet columnar-grain structure with a or discontinuous sheath coating.

Multiphase TBC systems possess a unique set of properties, which the individual constituents may not provide. The candidate TBC system consists of materials and/or phases that have formed as a result of a reaction between two or more materials that have been deposited on to the component substrate. The materials are selected based on their phase stability and possible reaction products between them. The reaction products, which are the final sheath coatings 32' and 34' of FIGS. 2 and 3, are selected such that they are phase stable to high temperatures, possess low thermal conductivity and have a low tendency to sinter. In addition, the reaction product can be selected to provide improved corrosion and erosion resistance.

FIG. 2 illustrates a multiphase TBC system as processed by the approach described in this invention. A TBC 20 is deposited on to a MCrAly coated superalloy substrate via an APS process. It has the columnar grain structure 28 and the chemical formula denoted by $(A,B)_xO_y$. This coating is the underlying TBC. Another ceramic coating 32 is deposited as a precursor coating on top of the underlying TBC, and is denoted as $C_ZO_w$, hereafter referred to as the overlay coating. This precursor sheath overlay can be deposited by processes which allow for its deposition on top of the EBPVD columns and also its infiltration in between the columns, such as by a chemical vapor deposition technique or a sol-gel technique or combinations thereof. According to this invention, the two materials, $(A,B)_xO_y$ and $C_ZO_w$ react to form a new sheath overlay phase/material on the surfaces of the EB/PVD columns. Thus, overlays 32 and 34 are transformed into 32' and 34', generally after heating over 1200° C. The exact composition of the underlying and the overlay TBCs is dependent on the phase stability of the two reactant materials and the final reaction product desired at the surface temperature during service. Due to the formation of the desired coating at the surface by a chemical reaction, the reaction product 32' and 34' will be in thermodynamic equilibrium with the coating and would not completely dissolve completely into the columns upon long term service at high temperatures.

The overlay sheath coating can be present as a continuous thin coating over all the column surfaces, shown as sheath 32' in FIG. 2 or be present as discontinuous nodules shown as sheath 34' in FIG. 3. The morphology of the reaction product will be dictated by the morphology of the precursor overlay coating. In contrast to the continuous thin coatings, the nodular morphology shown in FIG. 3, is likely to have a reduced tendency to form bridges between columns, due to lesser contact area between the nodules on adjacent columns. Any formation of intermitted bridges between the nodules are likely to easily break upon regular thermal cycling, thus maintaining the strain tolerance of the TBC. The morphology control or variation can be obtained by deposition of coatings to various thicknesses. For thin $C_zO_w$ coatings, the final result could be as shown in FIG. 3 whereas for thicker coatings the final result could be similar to FIG. 2. The thickness of the final reaction product sheath can vary between 2 Angstrom Units (0.0002 micrometer) to about 10 micrometers. Deposition process parameters can also be varied to provide the control over the morphology. The depth of infiltration into the microcrack volume 30 between columns 28 can be controlled depending upon the required temperature resistance infiltration should not be as deep as shown in FIG. 3.

In the TBC material $(A,B)_xO_y$, A is a material that can be used, preferably in minor dopant amounts or in amounts in excess of material B. A and B are preferably selected from the group consisting of Al, Ca, Mg, Zr, Y, Sc and rare earth elements, where rare earth is selected from La, Ce, Pr, Nd, Pm, Sm, Eu, Gd, Tb, Dy, Ho, Er, Tm and Yb, and where Y for A and Zr for B are preferred. In the precursor sheath overlay $C_zO_w$, C can be any A or B compound listed above, which preferably is not used as A or B, but C is preferably Al, that is, if A=Ca and B=Mg, then C should not be Ca or Mg. When $(A,B)_xO_y$ is in contact with $C_zO_w$, and when a reaction is prompted, the reaction product can be an oxide of A and C or an oxide of B and C. Selection of an appropriate substrate temperature during the deposition process or modification of the deposition conditions can lead to the formation of a reaction product without the need for a heat treatment step.

Generally the temperature of the TBC decreases across the thickness of the TBC from the top outside surface to the substrate. If the multiphase TBC is required only where the temperatures are highest, then the infiltration depth of the $C_zO_w$ coatings would have to be controlled. Modification of the deposition parameters can control the depth of infiltration of the coating and consequently, the depth of the reaction product across the thickness of the TBC. The depth of the infiltration would also depend on the variation of the intercolumnar gaps from the free surface to the coating/substrate interface. The thickness of the underlying TBC and the overlay coating can be modified to obtain a specific thickness and volume of the reaction product. The total thickness of the final multiphase TBC system will range from 0.0112 cm to 0.254 cm (5–100 mils). Also, two or more overlay coatings, such as $C_zO_w$ and $D_pO_q$ could be deposited over the EBPVD columns and the final reaction product could be a result of a reaction between $(A,B)_xO_y$, $C_zO_w$ and $D_zO_w$ Although the multiphase TBC system should possess a high thermal expansion, the reaction products need not have a high thermal expansion. The thermal expansion mismatch between the reaction product and the underlying APS TBC can be allowed to be sufficiently high to introduce cracks in the reaction product due to coefficient of thermal expansion mismatch stress. This is beneficial in breaking up any bonds that may have formed during sintering. The overlay coatings can be deposited by electron beam evaporation, air plasma spray, chemical vapor deposition and sol-gel techniques or combinations of the processes.

This multiphase TBC system has the unique combination of low thermal conductivity, high thermal expansion, long term phase stability and good strain compliance. The high thermal expansion, low thermal conductivity and long term phase stability is provided by the yttria stabilized zirconia. 10–60YSZ is phase stable as a cubic crystal structure upon long term exposure and also has low thermal conductivity of 1–2 W/mK (Watt/meter ° Kelvin). The presence of $Y_2O_3$ in the stabilized zirconia aids in the sintering of the TBC columns, but due to its presence the strain compliance of the coating is expected to be somewhat compromised. This is alleviated by the formation of the reaction product, YAG. YAG has a low thermal conductivity—lower than 2–3 W/mK at temperatures higher than 1000° C. In addition, even at about 1400° C., the reaction product does not show a tendency to sinter. Since the reaction product is also formed between the columns, it is expected to keep the coatings strain compliant. Also, the reaction product is in thermodynamic equilibrium with the YSZ columns. This will guarantee the presence of the reaction product over the long term service of the component. Thus, this multiphase TBC system is expected to meet the requirements of TBCs for use at very high temperature for long term exposure.

What is claimed is:

1. A turbine component comprising a metal alloy substrate and a columnar thermal barrier coating on the substrate surface, the coating having (a) a columnar-grained ceramic oxide structural base material and (b) a heat resistant ceramic oxide sheath material covering the columns of the base, where the sheath comprises the reaction product of a ceramic oxide precursor sheath material which consists essentially of the composition $C_zO_w$ and the ceramic oxide columnar structural material which consists essentially of the composition $(A,B)_xO_y$, where A and B are selected from stable oxides which will react with $C_zO_w$, and C is selected from stable oxides that will react with $(A,B)_xO_y$.

2. The turbine component of claim 1, where the reaction product is formed by heating the ceramic oxide precursor sheath material and the ceramic oxide columnar structural material.

3. The turbine component of claim 1, where A, B and C are selected from the group consisting of Al, Ca, Mg, Zr, Y, Sc and rare earth elements, where rare earth is selected from La, Ce, Pr, Nd, Pm, Sm, Eu, Gd, Tb, Dy, Ho, Er, Tm and Yb.

4. The turbine component of claim 1 where the substrate is a superalloy.

5. The turbine component of claim 1, where the sheath is a continuous layer completely covering the columns of the base.

6. The turbine component of claim 1, where the sheath is a discontinuous layer partially covering the columns of the base.

7. The turbine component of claim 1, where the component is selected from the group of turbine blades, turbine vanes, turbine brackets, and turbine nozzles.

* * * * *